US012411347B2

(12) United States Patent
Kim et al.

(10) Patent No.: US 12,411,347 B2
(45) Date of Patent: Sep. 9, 2025

(54) POLYMER ROD THAT SHAPES EMITTED LIGHT INTO SYMMETRICAL LIGHT (71) Applicant: LESSENGERS Inc., Pohang-si (KR)

(72) Inventors: Chong Cook Kim, Seoul (KR); Myeong Ho Kim, Pohang-si (KR)

(73) Assignee: LESSENGERS Inc., Pohang-si (KR)

( * ) Notice: Subject to any disclaimer, the term of this patent is extended or adjusted under 35 U.S.C. 154(b) by 408 days.

(21) Appl. No.: 18/021,215

(22) PCT Filed: Aug. 3, 2021

(86) PCT No.: PCT/KR2021/010144
§ 371 (c)(1),
(2) Date: Feb. 14, 2023

(87) PCT Pub. No.: WO2022/035112
PCT Pub. Date: Feb. 17, 2022

(65) Prior Publication Data
US 2023/0324704 A1 Oct. 12, 2023

(30) Foreign Application Priority Data

Aug. 14, 2020 (KR) .......... 10-2020-0102178

(51) Int. Cl.
G02B 27/09 (2006.01)
G02B 1/04 (2006.01)
H01S 5/02253 (2021.01)

(52) U.S. Cl.
CPC ......... *G02B 27/0916* (2013.01); *G02B 1/041* (2013.01); *G02B 27/0966* (2013.01); *H01S 5/02253* (2021.01)

(58) Field of Classification Search
CPC .................. G02B 27/0916; G02B 27/0966
See application file for complete search history.

(56) References Cited

U.S. PATENT DOCUMENTS

| 11,735,887 | B2* | 8/2023 | Sorg .................... H01S 5/02325 372/49.01 |
| 2014/0286367 | A1 | 9/2014 | Scofield et al. |
| 2020/0313399 | A1 | 10/2020 | Sorg et al. |

FOREIGN PATENT DOCUMENTS

| KR | 10-2012-0105037 | 9/2012 |
| KR | 10-2015-0102180 | 9/2015 |
| KR | 10-2018-0015354 | 2/2018 |
| WO | WO 2019/072759 | 4/2019 |

OTHER PUBLICATIONS

International Search Report and the Written Opinion Dated Dec. 23, 2021 From the International Searching Authority Re. Application No. PCT/KR2021/010144 and Its Translation of Search Report Into English. (8 Pages).

* cited by examiner

Primary Examiner — Joseph P Martinez

(57) ABSTRACT

The present invention relates to a polymer rod that shapes emission light emitted from a light source chip into symmetrical light and, more particularly, to a polymer rod that is formed on a light emission part of a laser diode so as to change the shape of emission light.

5 Claims, 7 Drawing Sheets

POLYMER ROD THAT SHAPES EMITTED LIGHT INTO SYMMETRICAL LIGHT

RELATED APPLICATIONS

This application is a National Phase of PCT Patent Application No. PCT/KR2021/010144 having International filing date of Aug. 3, 2021, which claims the benefit of priority of Republic of Korea Patent Application No. 10-2020-0102178 filed on Aug. 14, 2020. The contents of the above applications are all incorporated by reference as if fully set forth herein in their entirety.

FIELD AND BACKGROUND OF THE INVENTION

The present invention relates to a polymer rod that shapes emission light emitted from a light source chip into symmetrical light and, more particularly, to a polymer rod that is formed on a light emission part of a laser diode so as to change the shape of emission light.

A laser diode is also called a semiconductor laser and is an optical device abbreviated as LD. Light generated by injecting current is amplified between two mirrors to generate laser oscillation, and a laser diode may be referred to as an LED that emits light by amplifying light through a reflector. Since a laser diode outputs light with a single wavelength having a narrow spectral width and a constant phase and high directivity, energy control is easy.

Figure 4:
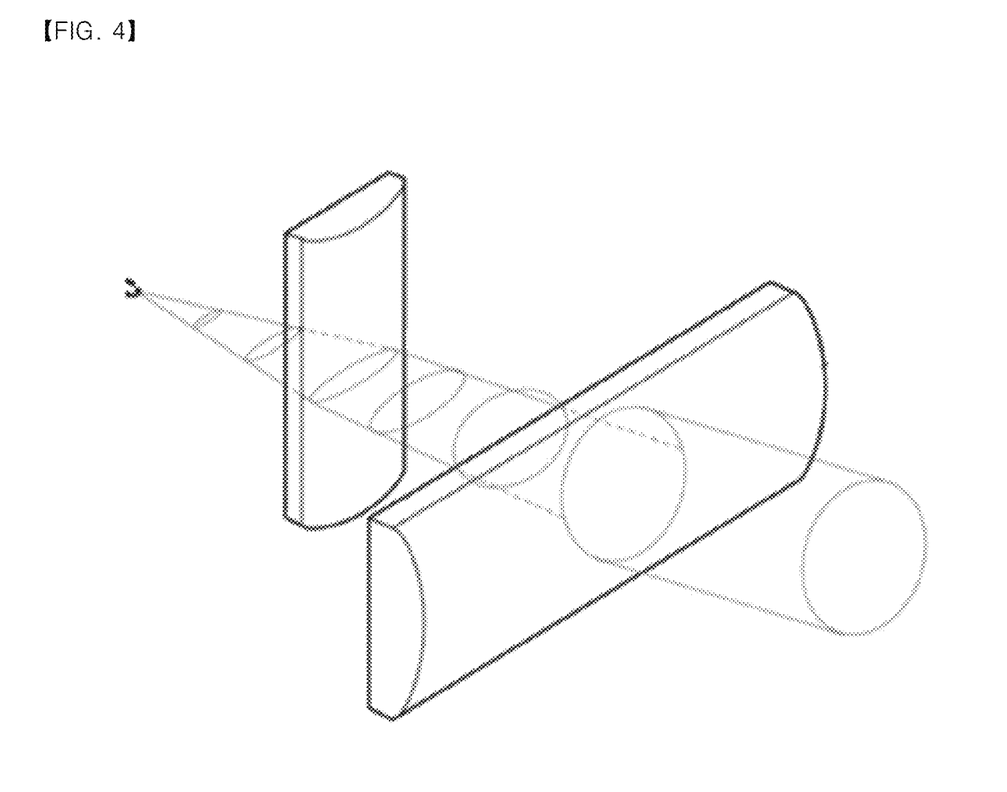
FIG. 4 is a schematic diagram of a light condensing lens having a cylindrical structure used in a conventional laser diode.

Conventional laser diodes emit asymmetric light, but a circular shape is required to condense the light emitted from the laser diode or use it for other purposes. To this end, conventionally, a lens having a cylindrical structure as shown in FIG. 4 is used, which has a complicated structure and incurs a lot of cost. Alternatively, a lens optical system is also added, but in this case, there is a problem in that the module becomes bulky.

Korean Patent Registration No. 10-0171374 discloses a laser module including a light condensing lens and a lens fixing method. The above patent discloses a laser diode for outputting an optical signal corresponding to an electrical signal, an optical fiber for transmitting an optical signal output to an external circuit, and a light condensing lens disposed between the laser diode and the optical fiber for concentrating the optical signal output on the optical fiber.

In addition, Korean Patent Registration No. 10-0438290 discloses an optical pickup device for recording and reproducing data on an optical recording medium using a laser, including a light condensing lens for guiding and concentrating light from a light source to a monitor photo detector (MPD).

SUMMARY OF THE INVENTION

The present invention is to provide a polymer rod capable of transforming emission light, in particular, asymmetric light, emitted from a light source chip into symmetrical light and replacing an existing lens.

The above object is achieved by a polymer rod which is formed on a light emission part of a light source chip, wherein the polymer rod shapes emission light emitted from the light source chip into symmetrical light, wherein the polymer rod is prepared by a method comprising the steps of aligning a micropipette filled with a polymer rod material solution to the light emission part of the light source chip; forming a meniscus of the polymer load material solution; and drawing out and extending the micropipette in a direction perpendicular to a surface of the light emission part and evaporating a solvent of the polymer rod material solution to prepare the polymer rod.

Preferably, the polymer rod may be a tapered shape, a cylindrical shape, or a lens shape.

In addition, preferably, the polymer rod may be prepared by being directly grown on the light emission part.

In addition, preferably, the polymer rod may be formed of a polymer having a refractive index of 1.3 to 2.0.

In addition, preferably, a surface of the polymer rod connected to the light emission part may have a diameter of 1 mm or less and a height of 10 mm or less.

The polymer rod according to the present invention can transform the asymmetric light emitted from a light emission part of a light source chip into symmetrical light. In addition, depending on the characteristics of emission light, the shape of the polymer rod can be adjusted to change the shape of light into a desired shape, and the light can be transmitted to a desired area.

DESCRIPTION OF SPECIFIC EMBODIMENTS OF THE INVENTION

All the technical terms used for the present invention have the following definitions, as long as the terms are differently defined, and have the same meanings as terms that are generally understood by those skilled in the art. In addition, a preferable method and sample are disclosed in the present specification, but things that are slimier or equal to the same are included in the range of the present invention.

The present invention relates to a polymer rod formed in a light emission part of a light source chip. According to one embodiment of the present invention, the light source chip may be a layer diode.

The polymer rod may have a tapered shape, a cylindrical shape, or a lens shape.

According to one embodiment of the present invention, the polymer rod may be prepared by being directly grown on the light emission part. The polymer rod may be formed on the light emission part to transform asymmetric light emitted from the laser diode into symmetric light.

Specifically, the polymer rod according to the present invention may be manufactured by a method including the following steps:
  a) filling a micropipette with a polymer load material solution; b) aligning the micropipette to a light emission part of a light source chip; c) forming a meniscus of the polymer load material solution; and d) preparing a polymer rod by drawing and extending the micropipette in a direction perpendicular to the surface of the light emission part and evaporating the solvent of the polymer rod material solution.

Here, the polymer rod material solution is a material capable of forming a meniscus and may include a polymer having a refractive index of 1.3 to 2.0. Specifically, polystyrene, poly(methyl methacrylate), and polycarbonate may be used, and epoxies such as polyimide and SU-8 may also be used. A material (volatile material) that easily evaporates may be used as the solvent of the polymer rod material solution, and includes all materials used in the art.

The polymer rod according to the present invention is preferably transparent at the wavelength of the light source, and more preferably has a transmission performance of 50% or more.

The micropipette may be manufactured to a desired diameter using a pipette puller.

In step b), the micropipette is vertically aligned on the surface of the light emission part, and a meniscus of the polymer rod material solution is formed.

When the micropipette is drawn while maintaining a distance sufficient to induce the meniscus of the polymer rod material solution, the liquid inside evaporates rapidly and the dissolved material solidifies to form a column. Preferably, the micropipette is drawn in a direction perpendicular to a direction in which light is emitted, that is, a portion where the polymer rod contacts the contact point.

In one embodiment, the micropipette may be drawn while accelerating or decelerating the withdrawal speed so that the outer circumferential surface of the polymer rod has a shape in which it narrows upward or downward. The withdrawal speed may be adjusted in consideration of the angle of the height-direction axis of the polymer rod, the height of the polymer rod, and the like.

In another embodiment, the pressure applied to the micropipette may be adjusted so that the outer circumferential surface of the polymer rod narrows upward or downward. When the pressure applied to the inside of the micropipette increases, the discharge amount of the polymer rod material solution increases and the diameter of the polymer rod increases, and when the pressure applied inside the micropipette decreases, the discharge amount of the polymer load material solution decreases, and the diameter of the polymer rod decreases.

The polymer rod according to the present invention preferably has a structure and size that can sufficiently include the light emission part. Preferably, the polymer rod may have a tapered structure that narrows or widens in the light emission direction, and may be prepared in a cylindrical structure or lens shape.

Preferably, the surface of the polymer rod connected to the light emission part according to the present invention may have a diameter of 1 mm or less and a height of 10 mm or less. Further, the ratio of the diameter and height of the polymer rod is preferably within 1:50, more preferably within 1:10.

Figure 1:
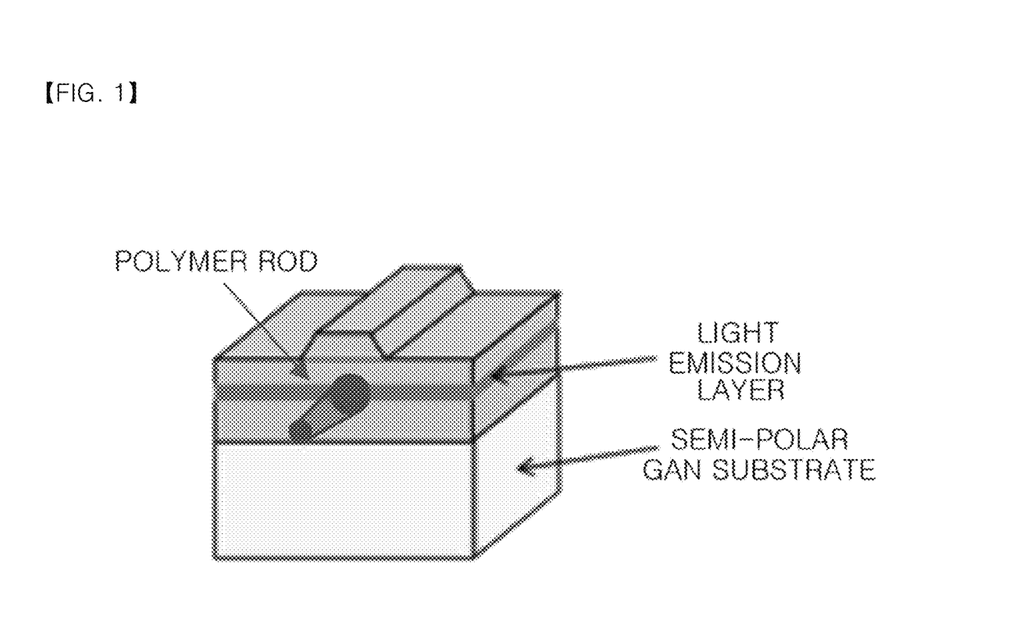
FIG. 1 schematically shows that a polymer rod according to the present invention is formed on a light emission part of a laser diode.

FIG. 1 schematically shows that a polymer rod according to the present invention is formed on a light emission part of a laser diode.

The laser diode in which the polymer rod according to the present invention is formed is preferably an edge emitting laser diode, but may be any device that emits light asymmetrically. In addition, even a device that emits symmetrical light may be used to adjust and control the position of a light source.

When the polymer rod according to the present invention is applied to a light emitting device, light can be transmitted to a desired site. In another embodiment of the present invention, when the polymer rod is applied to a light receiving element rather than a light emitting element, it may be used as a light receiving structure having directivity.

Hereinafter, the present invention will be described in detail by way of examples, but is not limited thereto.

Preparation of Example

A blue GaN laser diode chip grown on a sapphire substrate is used as an example. It is an edge emitting laser diode structure with ridges. It has a ridge width of about 10 μm. The light emission part of the laser diode was prepared with a polymer solution in which PMMA was mixed with toluene. The area of the polymer rod in contact with the laser diode had the diameter of 10 μm and the height of 35 μm. After the polymer solution was put into the pipette, it was brought into contact with the laser diode to form a meniscus, and as toluene, which was a solvent, was volatilized from the drawn and ejected polymer solution, a solid polymer rod was formed in real time.

In addition, a polymer lens was also prepared by setting the height of the polymer to a thickness similar to the diameter in contact with the laser diode.

Figure 2A:
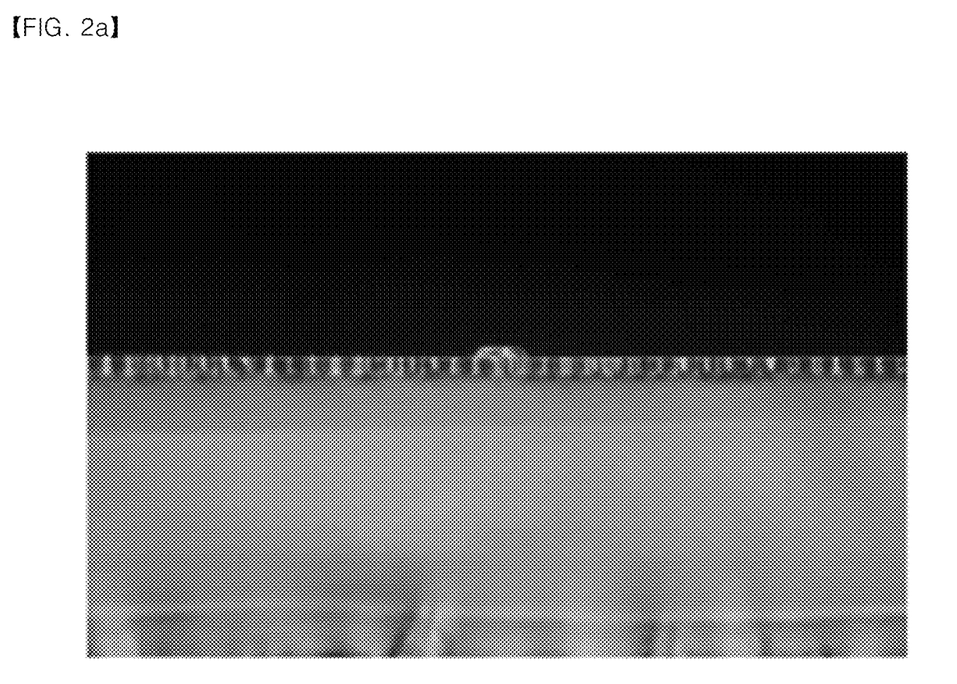
FIG. 2a is an optical micrograph of a laser diode in which a polymer rod is not formed.
Figure 2B:
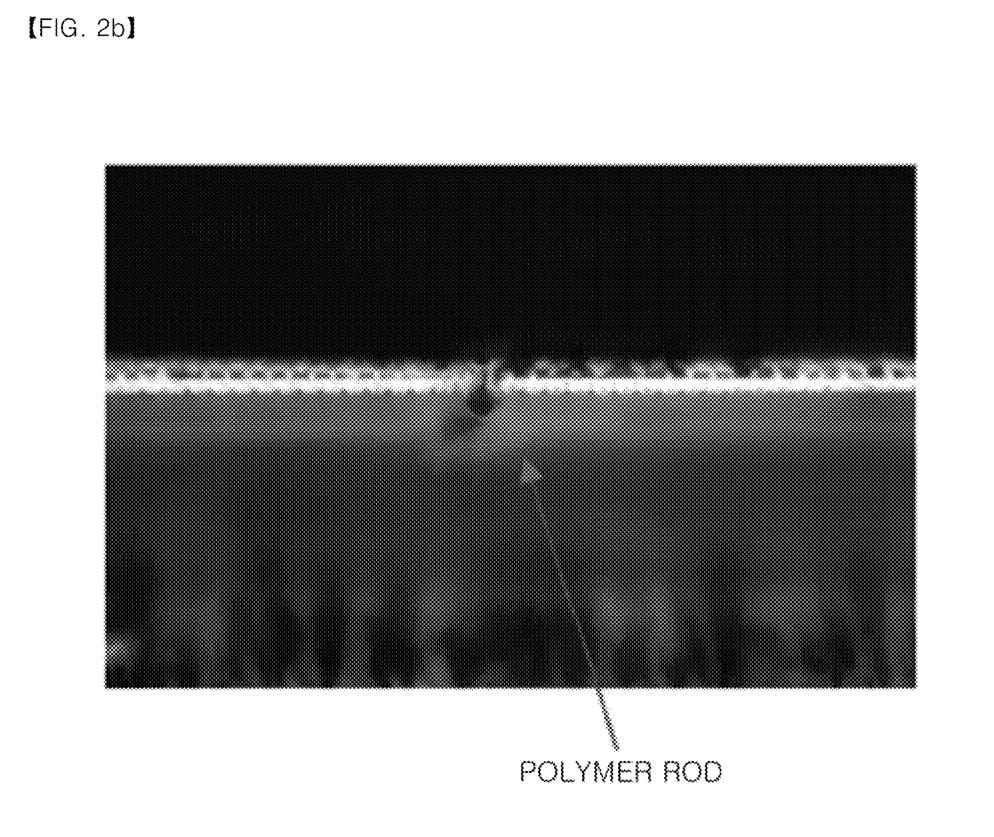
FIG. 2b is an optical micrograph of a laser diode in which a polymer rod of the present invention is formed.
Figure 2C:
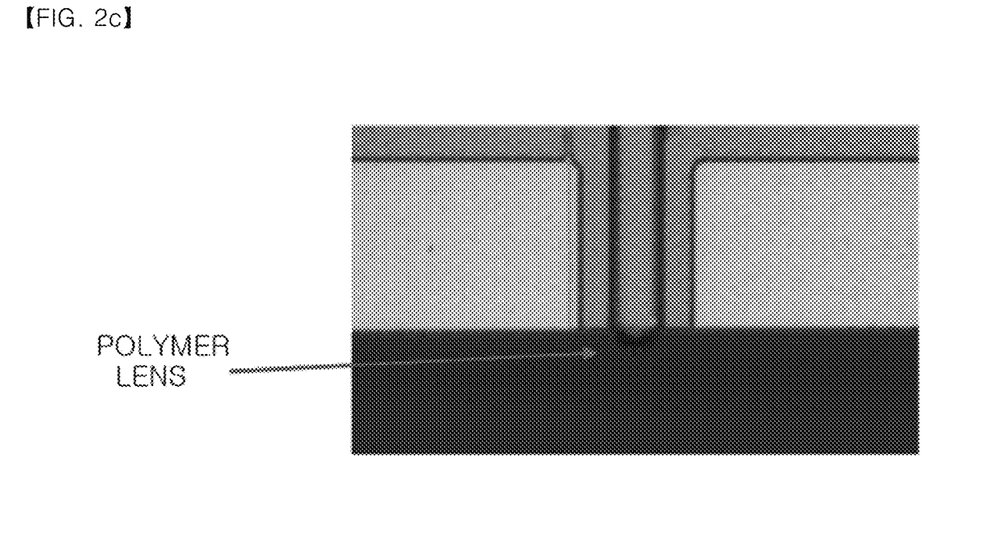
FIG. 2c is an optical micrograph of a laser diode in which a polymer rod of the present invention is formed in a lens shape.

Experimental Example 1: Optical Microscope Measurement of Laser Diode Emission Light In the above embodiment, an optical micrograph of the laser diode before the polymer rod is formed is shown in FIG. 2a, an optical microscope photograph of the laser diode in which the polymer rod is formed in the above embodiment is shown in FIG. 2b, and an optical micrograph of the laser diode in which a polymer lens shape is formed is shown in FIG. 2c. Referring to FIG. 2b, it can be confirmed that a polymer rod is formed on the light emission part of the laser diode, and FIG. 2c shows that a polymer lens is formed on the light emission part of the laser diode.

In addition, the light emitted by operating the laser diode was measured with an optical microscope.

Figure 3A:
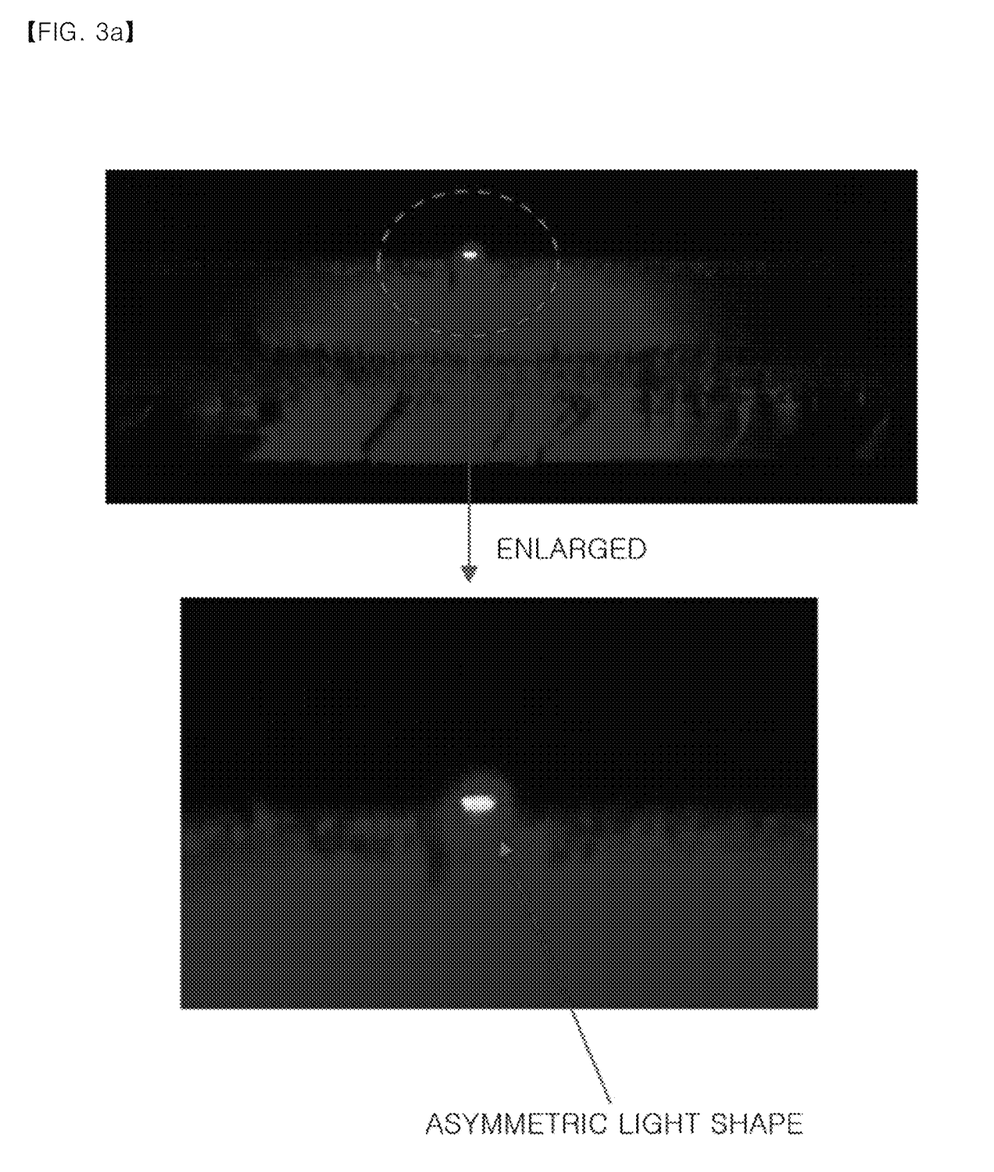
FIG. 3a is an optical micrograph of a light emission part of a laser diode in which a polymer rod is not formed.
Figure 3B:
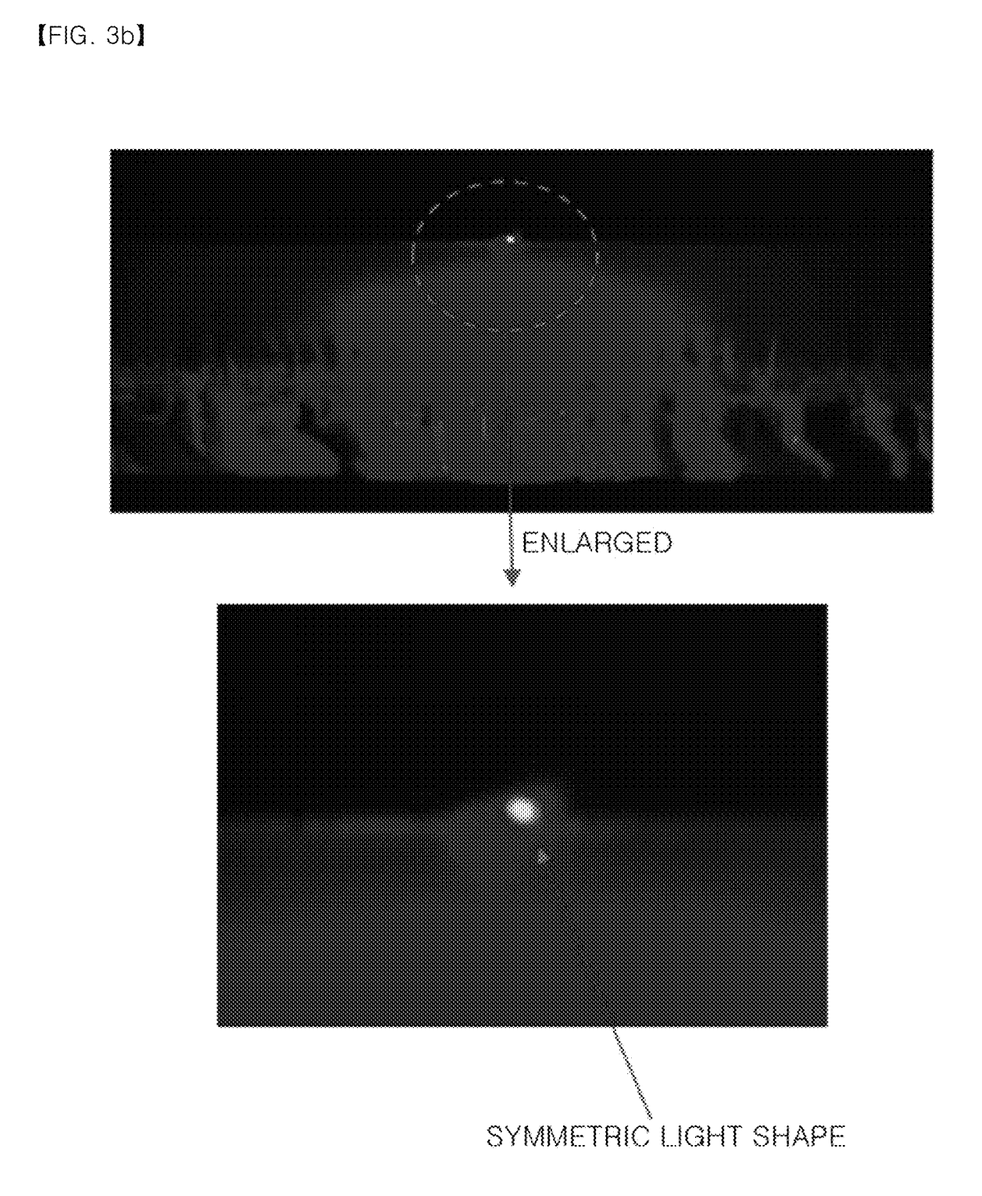
FIG. 3b is an optical micrograph of a light emission part of a laser diode in which a polymer rod of the present invention is formed.

FIG. 3a is an optical micrograph of the light emission part of the laser diode in which the polymer rod is not formed, and FIG. 3b is an optical micrograph of the light emission part of the laser diode in which the polymer rod of the present invention is formed. Referring to FIG. 3a, it can be seen that the emitted light is asymmetrical, but in FIG. 3b, it can be seen that the emitted light is symmetrical.

The invention claimed is:

1. A polymer rod which is formed on a light emission part of a light source chip, wherein the polymer rod shapes emission light emitted from the light source chip into symmetrical light, wherein the polymer rod is prepared by a method comprising the steps of aligning a micropipette filled with a polymer rod material solution to the light emission part of the light source chip; forming a meniscus of the polymer load material solution; and drawing out and extending the micropipette in a direction perpendicular to a surface of the light emission part and evaporating a solvent of the polymer rod material solution to prepare the polymer rod.

2. The polymer rod of claim 1, wherein the polymer rod is a tapered shape, a cylindrical shape, or a lens shape.

3. The polymer rod of claim 1, wherein the polymer rod is prepared by directly contacting the light emission part.

4. The polymer rod of claim 1, wherein the polymer rod is formed of a polymer having a refractive index of 1.3 to 2.0.

5. The polymer rod of claim 1, wherein a surface of the polymer rod connected to the light emission part has a diameter of 1 mm or less and a height of 10 mm or less.

\* \* \* \* \*